(12) United States Patent
Stout et al.

(10) Patent No.: US 7,088,131 B1
(45) Date of Patent: Aug. 8, 2006

(54) SYSTEM AND METHOD FOR POWER GATING

(75) Inventors: Douglas W. Stout, Milton, VT (US); Charles H. Windisch, Jr., Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 11/161,334

(22) Filed: Jul. 29, 2005

(51) Int. Cl.
*H03K 19/003* (2006.01)
*G05F 3/02* (2006.01)
*H01L 21/00* (2006.01)

(52) U.S. Cl. .................. 326/33; 326/34; 327/537; 438/129

(58) Field of Classification Search ............... 326/33, 326/34; 327/537; 438/129
See application file for complete search history.

(56) References Cited

U.S. PATENT DOCUMENTS

| | | |
|---|---|---|
| 5,338,978 A | 8/1994 | Larsen et al. |
| 5,581,197 A | 12/1996 | Motley et al. |
| 5,736,869 A | 4/1998 | Wei |
| 6,064,230 A | 5/2000 | Singh |
| 6,288,563 B1 | 9/2001 | Mujono et al. |
| 6,359,484 B1 | 3/2002 | Ajit |
| 6,512,394 B1 * | 1/2003 | Parris .................. 326/34 |
| 6,586,974 B1 | 7/2003 | Humphrey et al. |

* cited by examiner

*Primary Examiner*—Evan Pert
(74) *Attorney, Agent, or Firm*—Michael J. LeStrange; Shelley Beckstrand

(57) ABSTRACT

Power is gated from global terrain to a voltage island while controlling leakage and managing transient power supply noise. The voltage island includes a field effect transistor (FET) power gate, a first connection to a global voltage source and a second connection to a disable signal source, and an island voltage net for supplying voltage to devices on the island. A power gate control circuit is responsive to the disable signal source for generating a test signal for selectively turning off the FET power gate as the disable signal source goes to a logical '1', and for turning on the FET power gate as said disable source goes to a logical '0'. The FET power gate is responsive to the disable signal source being off for connecting the island voltage net to the global voltage source. A turn on finisher circuit is responsive to the disable signal transitioning to on and to the test signal for holding the power gate solidly on; and a turn off finisher circuit is responsive to the disable signal transitioning to off and to the test signal for holding said power gate solidly off.

20 Claims, 11 Drawing Sheets

HEADER

SYSTEM AND METHOD FOR POWER GATING

BACKGROUND OF THE INVENTION

1. Technical Field of the Invention

This invention relates to power gating. More particularly, it relates to power gating in CMOS chip architectures that incorporate voltage islands.

2. Background Art

Leakage currents are skyrocketing as CMOS technologies evolve from 130 nm to 90 nm and below. Chip architectures that incorporate voltage islands have become more commonplace as designers attempt to manage this leakage, particularly in power-sensitive applications.

If the magnitude of a voltage surge/droop due to ground bounce is greater than the noise margin of a circuit, the circuit may erroneously latch the wrong value or switch at the wrong time. Traditionally, ground bounce has been a phenomenon associated with input/output buffers and internal circuitry. In addition, ground bounce originating from the power-mode transition of a power gating structure affects the reliability of a system-on-a-chip (SOC) employing multiple power gating domains, or islands, to control leakage power. This noise source may induce ground bounce in neighboring circuits which are executing normal operations.

Leakage can be managed within voltage islands by reducing the supply voltages of non-switching islands (e.g., those clock gated off) or better yet, by powering such islands off altogether.

Since it is generally impractical to incorporate large numbers of independent power supplies in a system, schemes that allow the power supplies of multiple islands to be switched (or gated) on-chip are quite attractive. Such power gating typically places one or more large PFET devices, often called headers, between the chip VDD and island VDD supply rails. Alternatively, one or more large NFET devices, often called footers, may be placed between the chip GND and island GND supply rails. In either case, these power gating devices ideally function as low resistance switches when on (to minimize performance loss due to their insertion), yet provide high impedances (low leakage) to the supply rails when off.

The use of headers and footers can create additional design challenges. When a header or footer is switched from off to on, a significant increase in current may occur as island capacitances are charged. Similarly, if a header or footer is switched from on to off without previously gating off circuit switching activity, a significant decrease in current demand will occur. Large, fast changes in current demand can create substantial transient power supply noise (L×di/dt) in the chip power supply rails, which can adversely effect the performance or stability of operational circuits elsewhere on the chip.

SUMMARY OF THE INVENTION

A system and method is provided for gating power from global terrain to a voltage island while controlling leakage and managing transient power supply noise by supplying a global voltage to a voltage island; supplying a disable signal to the voltage island; responsive to the disable signal, selectively shorting the global voltage to a voltage net on the voltage island through a field effect transistor (FET) power gate; operating a power gate control circuit responsive to the disable signal source to generate a test signal for selectively turning off the FET power gate as the disable signal source goes to a logical '1', and for turning on the FET power gate as the disable source goes to a logical '0'; operating the FET power gate responsive to the disable signal source being in a logic low state for connecting the island voltage net to the global voltage; operating a turn on finisher circuit responsive to the disable signal transitioning to a logic low state and to said test signal to hold the power gate solidly on; and operating a turn off finisher circuit responsive to the disable signal transitioning to off and to the test signal to hold the power gate solidly off.

Other features and advantages of this invention will become apparent from the following detailed description of the presently preferred embodiment of the invention, taken in conjunction with the accompanying drawings.

DETAILED DESCRIPTION OF BEST MODE

Figure 1:
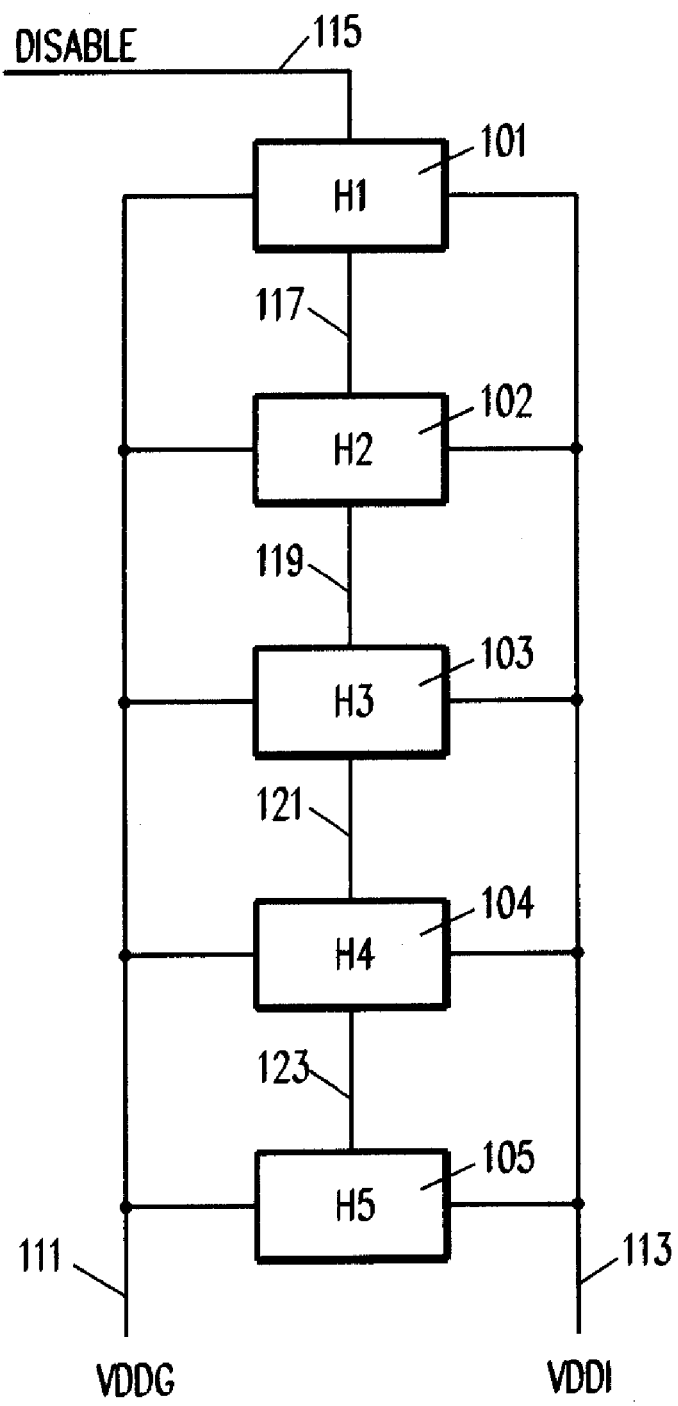
FIG. 1 is a diagrammatic representation of headers arranged in series on a voltage island.

Referring to FIG. 1, by way of illustration of problems associated with prior solutions, five headers 101–105 are connected in parallel between the chip VDD 111 (VDDG) and the island VDD 113 (VDDI) for which they provide power gating. A single disable signal 15 is daisy chained, as is represented by lines 117, 119, 121, and 123, from header 101 to header 105. This architecture does not scale up particularly well for large numbers of headers. Since the number of headers typically increases in proportion to the area of an island, the turn-on and turn-off delay of such a gating scheme is a strong function of island size. Furthermore, since headers earlier in such a daisy-chain, such as headers 101 and 102, can turn on well before those late in the chain, such as headers 104 and 105, the earlier headers carry a large fraction of the current required to power up an island, which can lead to significant concentrations of current in the first headers in a chain and thus to 'hot spots' and potential electro-migration problems.

Figure 2:
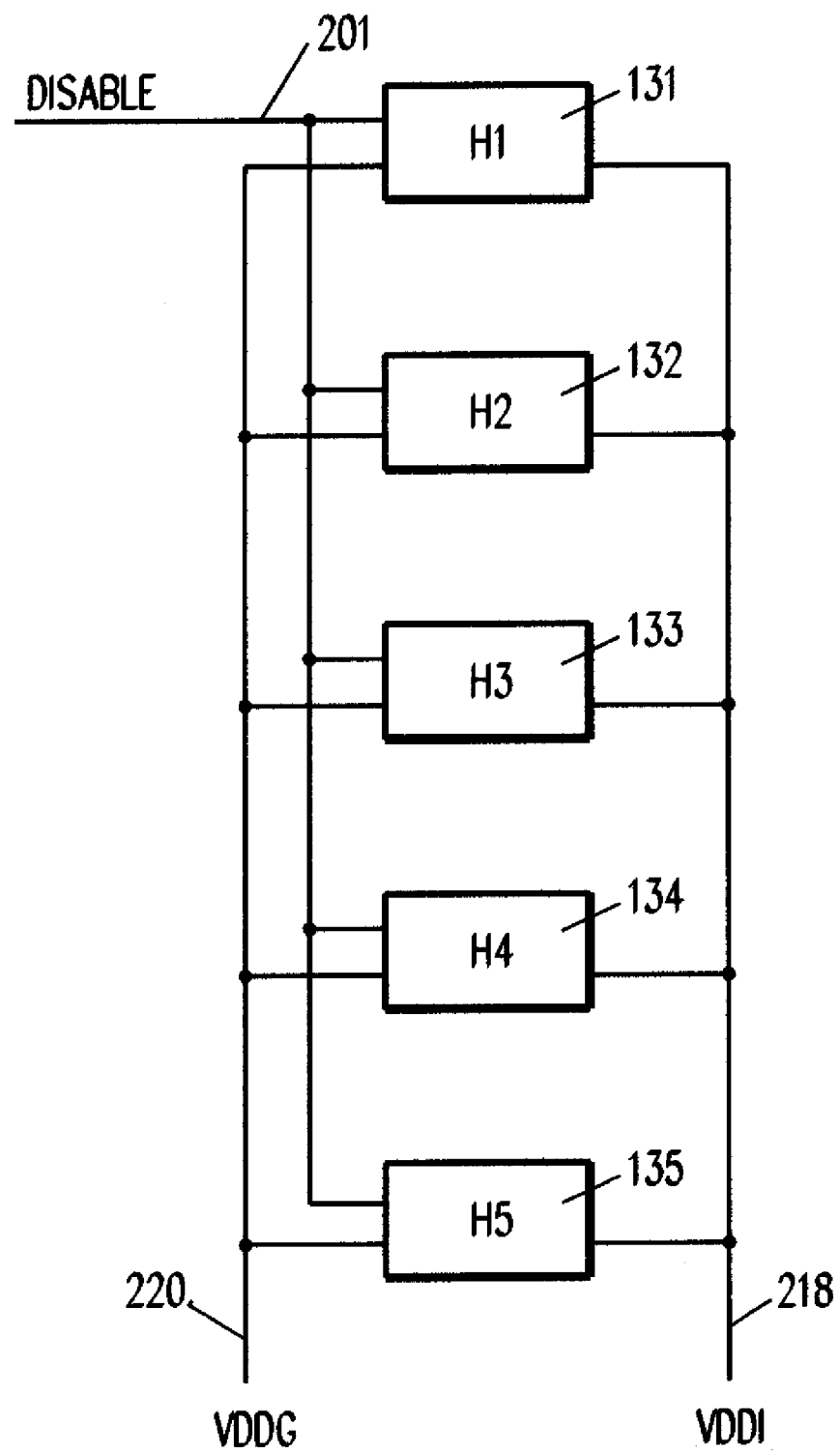
FIG. 2 is a diagrammatic representation of headers arranged in parallel on a voltage island.

Referring to FIG. 2, which illustrates an improved architecture over that of FIG. 1, five headers 131–135 are still connected in parallel between the chip VDD 220 (VDDG) and the island VDD 218 (VDDI) for which they provide power gating. However, disable line 201 which controls header turn on or turn off is fanned out, possibly with VDDG-referenced re-drive (not shown), to all headers 131–135 in parallel. By doing this, all headers turn on (or off) at the same time, thus avoiding non-uniform currents that could result in 'hot spots' or electro-migration problems. The trade-off is that this approach requires that the rate at which current is turned on or off be carefully controlled within each header to minimize transient noise problems.

Figure 3:
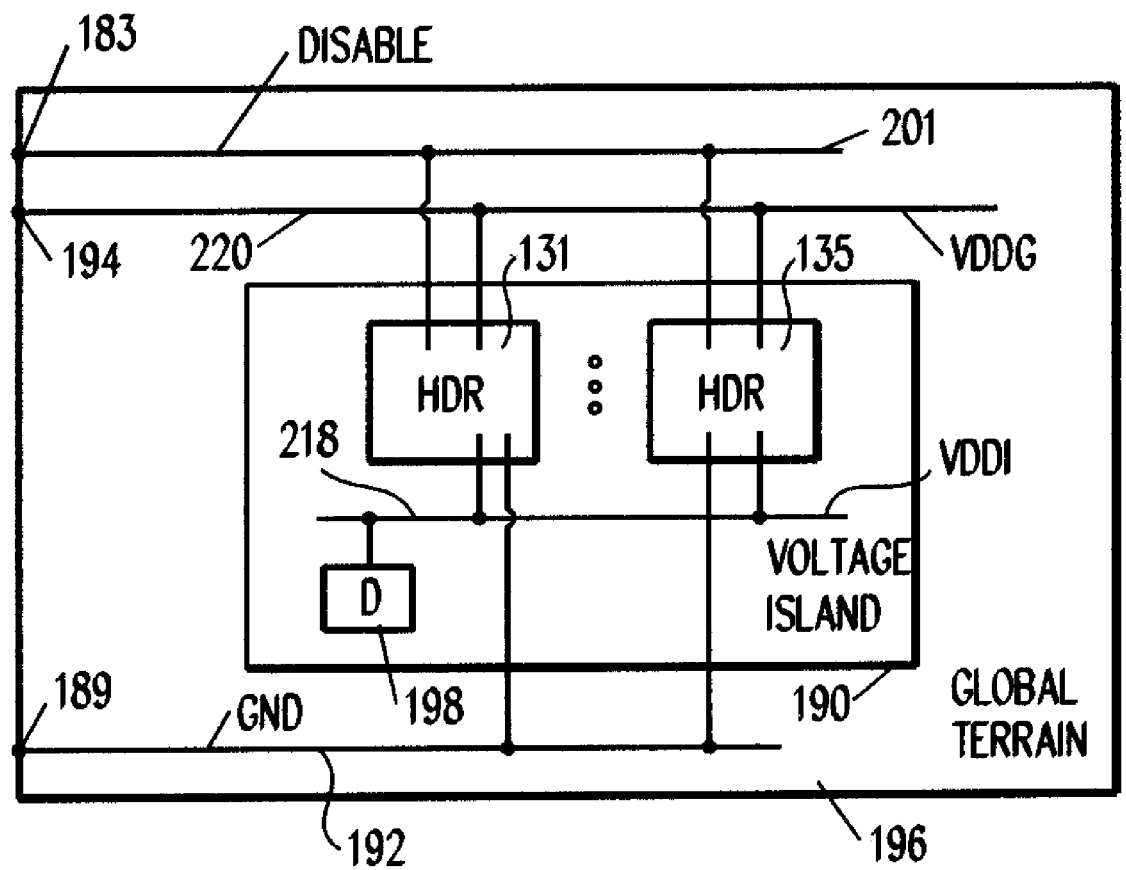
FIG. 3 is a diagrammatic representation of a voltage island.

Referring to FIG. 3, a diagrammatic view of a chip 196, referred to as the global terrain, includes a plurality of voltage islands 190 (one of which is illustrated). Each island 190 may contain a plurality of headers 131 . . . 135, to be described hereafter, which gate global voltage VDDG 220 from pad 194 to island voltage VDDI 218 and thence to devices 198 (one of which is illustrated) on island 190. Ground 192 is fed from pad 189 throughout global terrain 196 and voltage island 190. Disable line 201 is fed from pad 183 or from some device (not shown) on global terrain 196 to devices 131 . . . 135 on voltage island 190.

Figure 4:
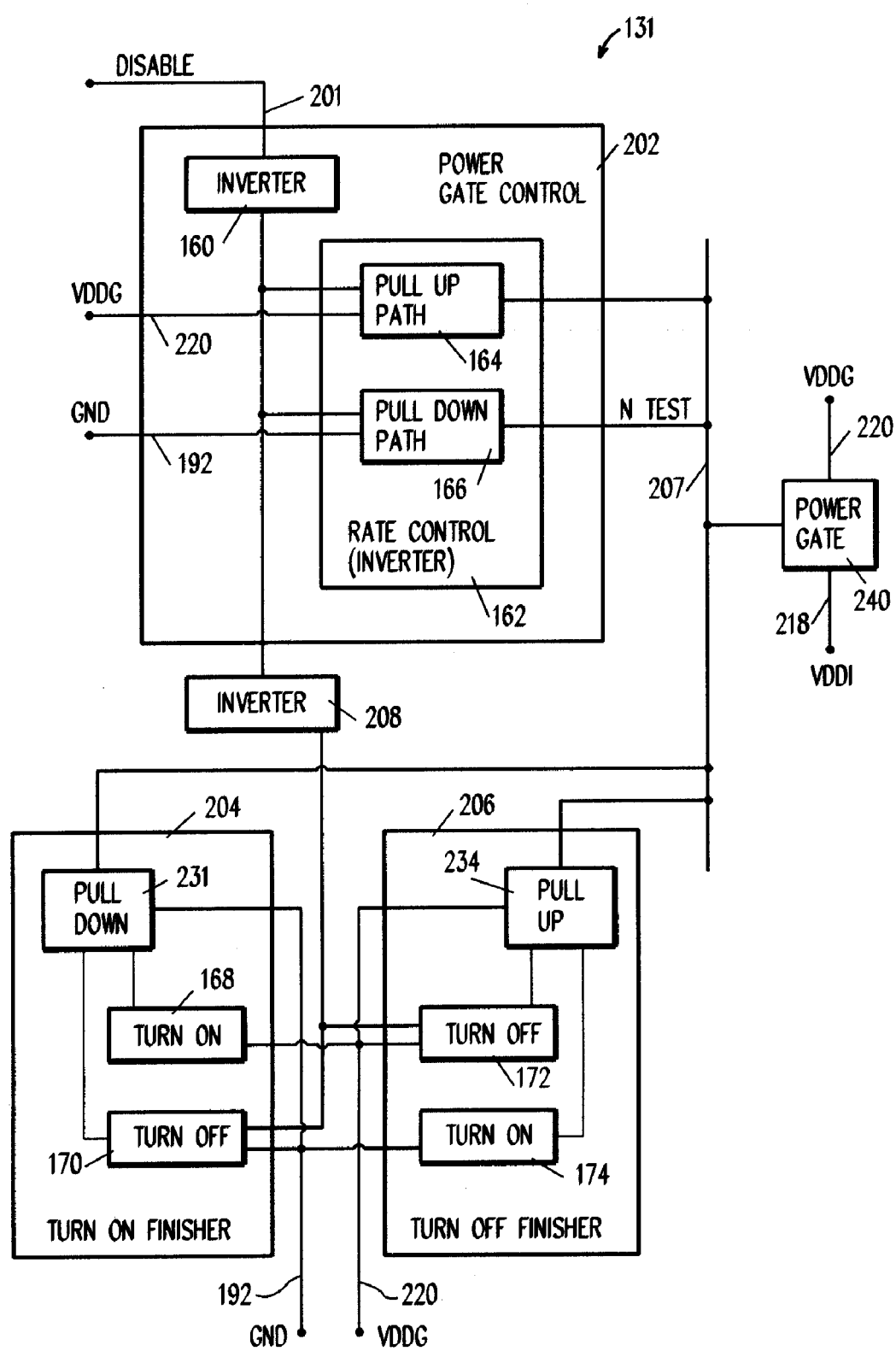
FIG. 4 is a diagrammatic representation of a header in accordance with the preferred embodiment of the invention.

Referring to FIG. 4, a header circuit 131 (which is identical to header circuits 132–135) which nicely addresses the transient noise problem includes power gate 240 connected between VDDI 218 (island voltage) and VDDG 220 (global voltage), power gate control 202, turn on finisher circuit 204 and turn off finisher circuit 206. Power gate control 202 is also connected to turn on finisher 204 and turn off finisher 206. Circuitry common to finishers 204 and 206, such as inverter 208, may be shared by circuits 204 and 206, or replicated in each of circuits 204 and 206.

In operation, responsive to disable signal 201, power gate control 202 selectively turns on and off power gate 240. The disable signal 201 is inverted first in inverter 160, and again in inverter 162, so that the signal on NTEST 207 is in phase with disable signal 201. When disable signal 201 transitions from a logical '1' to a logical '0', pull down path 166 slightly delays, in a manner to be described hereafter, and pulls NTEST down to ground 192, which turns on power gate 240 and connects, or shorts, VDDG 220 to VDDI 218. Turn on occurs when NTEST 207 reaches a transition voltage. When disable signal 201 transitions from a logical '0' to a logical '1', pull up path 164 slightly delays and pulls NTEST up to VDDG 220. Turn off occurs when NTEST 207 reaches a transition voltage. Turn on relies on pulldown path 166, as previously noted.

Note that power gate 240 is a PFET device in this embodiment. When the gate (NTEST in this case) drops below the source (VDDG here) by a threshold drop, power gate 240 turns on. So, when NTEST is at GND, the power gate is strongly ON. In PFET operation, when ON, the power gate connects VDDG to VDDI. That is, the power gate turns on when the voltage on NTEST falls below VDDG by at least a threshold voltage. The lower the voltage on NTEST, the harder the power gate turns on. Ideally, NTEST should be held at GND for maximum power gate turn-on, which is what this embodiment of the circuit of the invention does.

Turn on finisher 204 includes a pull down FET 231 which, in series with NTEST 207, forms a pull down path to hold the gate of PFET 240 at GND 192. Turn on device 168 and turn off device 170 include FET devices providing a turn on path and a turn off path, respectively, for FET 231. With NTEST 207 at GND, the power gate is fully turned on.

Figure 11:
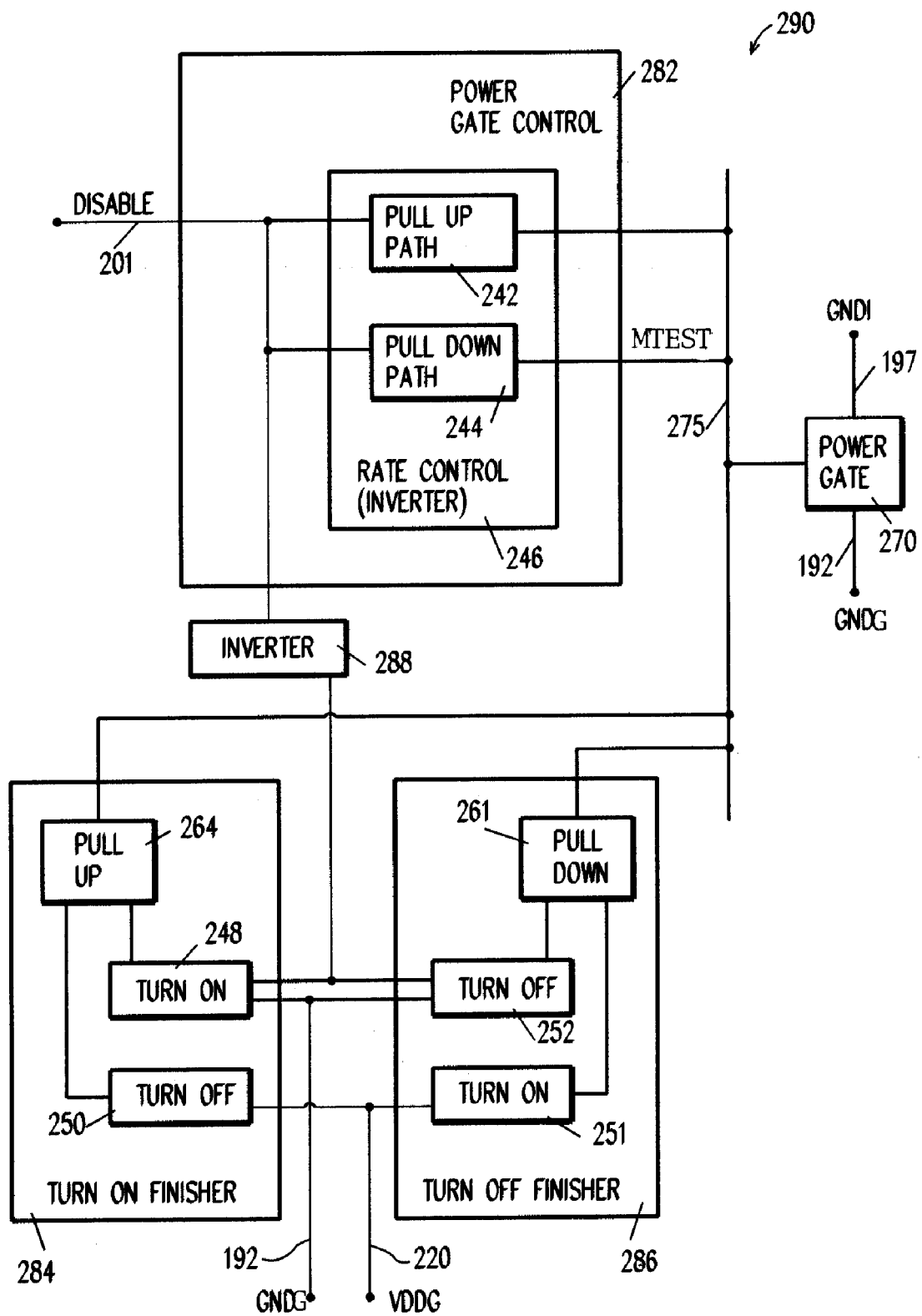
FIG. 11 is a diagrammatic representation of a footer in accordance with an alternative embodiment of the invention.

In both the header 131 and footer 290 configurations of FIGS. 4 and 11, respectively, when DISABLE 201 is high (logical '1'), the corresponding power gate 240, 270 is off.

Turn off finisher 206 includes a PFET device 234 which pulls up NTEST 207 to the VDDG 220 level. Turn on 174 and turn off 172, responsive to the output of inverter 208, and voltage levels 192 and 220, turn on and off, respectively, pull up PFET 234.

Figure 5:
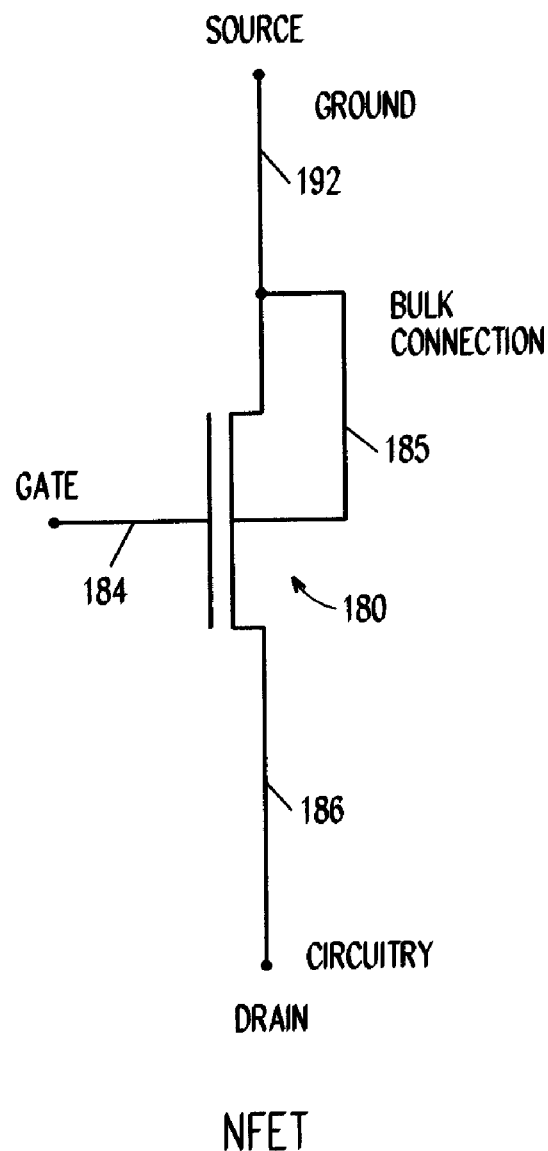
FIG. 5 is a diagrammatic representation of an NFET device.

Referring to FIG. 5, an example of a CMOS negative field effect transistor (NFET) 180 circuit comprises a gate 184, a drain 186, a source 192 and a substrate or bulk connection 185 to ground 192. In operation, as the voltage on gate 184 goes higher than the voltage on source 192 by some threshold voltage, NFET 180 turns on, shorting source 192 to drain 186.

Figure 6:
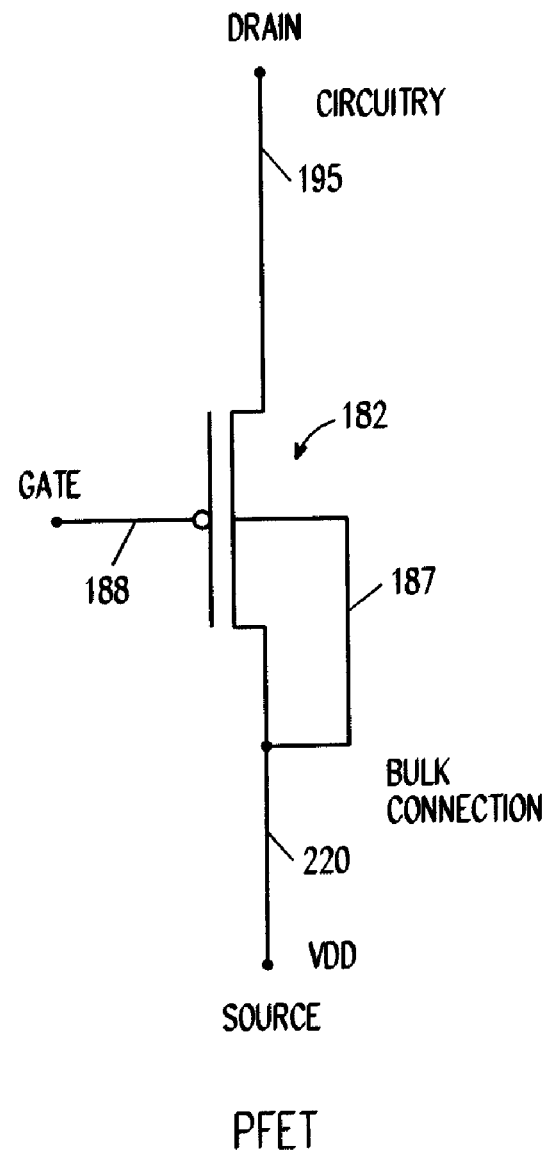
FIG. 6 is a diagrammatic representation of a PFET device.

Referring to FIG. 6, an example of a CMOS positive field effect transistor (PFET) 182 circuit comprises a gate 188, a drain 195, and a substrate or bulk connection 187 and source 220 to voltage VDD. In operation, as the voltage on gate 188 falls below the voltage on source 220 by some threshold voltage, PFET 182 turns on, shorting source 220 to drain 195.

Figure 7:
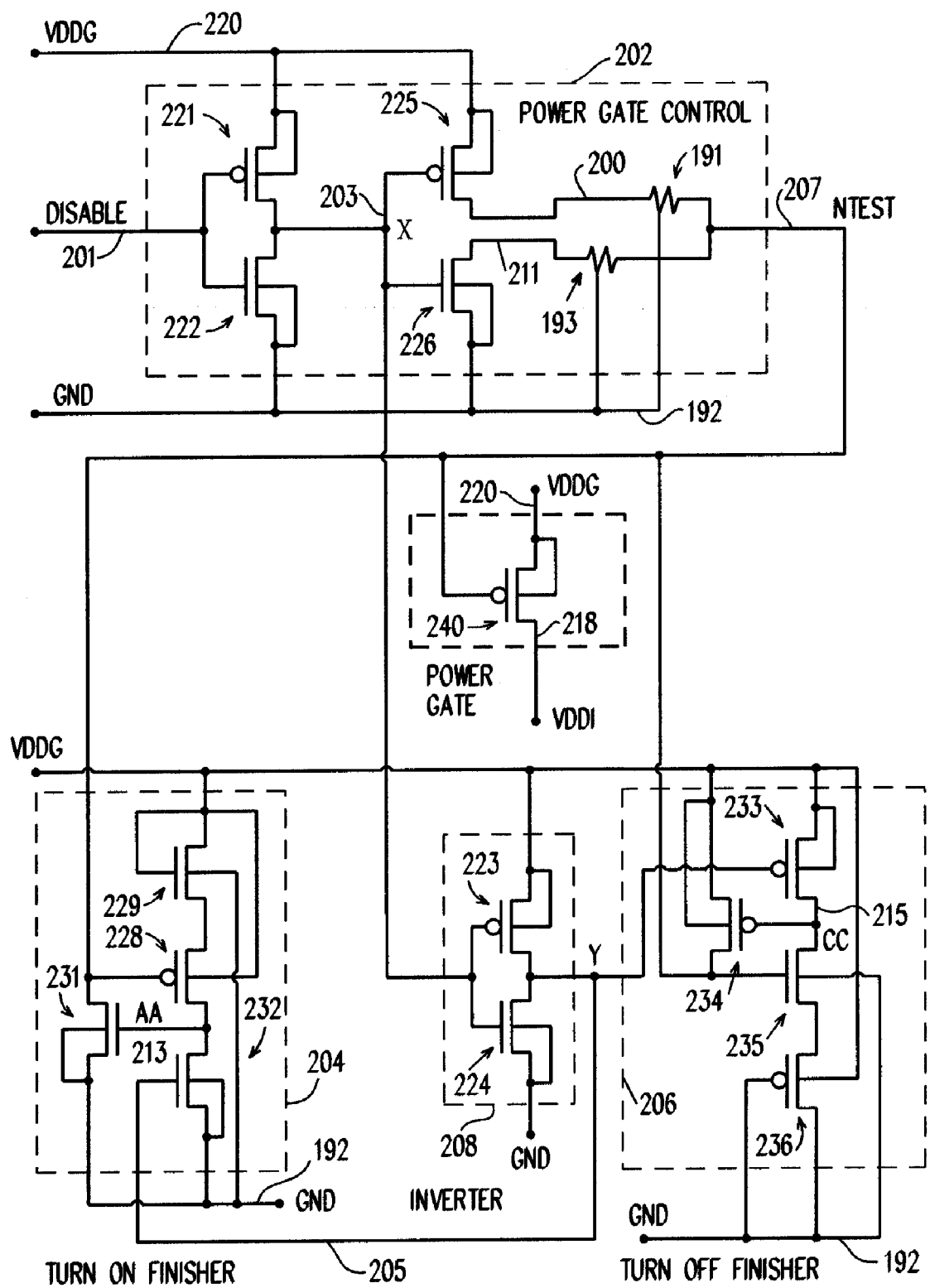
FIG. 7 is a more detailed diagrammatic representation of a preferred embodiment of a header device.

A complementary pair of FET devices is formed by connecting a common gate 184, 188 to an NFET 180 and PFET 182 with drain 186 of the NFET connected to drain 195 of the PFET. In a complementary pair, either the NFET or the PFET, but not both, may be on. An example of such a complementary pair is illustrated in FIG. 7 by PFET 221 and NFET 222. These FET devices have a common gate DISABLE 201, and with line 203 representing the drain of PFET 221 and drain of NFET 222.

Referring to FIG. 7, an example of the header circuit 131 of FIG. 4 is shown. Power gate 240, or THEADER 240, is a large header (PFET) device and represents most of the device width/area in the schematic of FIG. 7. In the circuitry of FIG. 7, power gate control 202 of FIG. 4 is implemented by transistor devices PFET 221, NFET 222, PFET 225, and NFET 226 (and, optionally, variable resistors 191 and 193); turn on finisher 204 is implemented by transistor devices 228, 232, 229, and 231; turn off finisher 206 is implemented by devices 233, 234, 235 and 236; and shared or common circuitry 208 is represented by devices 223 and 224, in this case providing an inversion function.

DISABLE 201 is connected to the gates of PFET 221 and NFET 222. VDDG 220 is connected to the source of PFET 221, the source of PFET 225, the gate and drain of NFET 229, to the bulk connection of PFET 228, to the source of PFET 240, to the source of PFET 223 to the sources of PFET 234 and 233, and to the bulk connection of PFET 236. GROUND 192 is connected to the sources of NFETs 222, 226, 231, 232, 224, and 236. The drain of PFET 221 and the drain of NFET 222 form line X, which is fed to the gates of PFET 225, NFET 226, PFET 223, and NFET 224. The drain 200 of PFET 225 and drain 211 of NFET 226 combine through variable resistors 193 and 191, respectively, to form NTEST 207, which is fed to the gate of PFET 228, drain of NFET 231, the gate of PFET 240, the drain of PFET 234 and gate of NFET 235. PFET 228 drain and NFET 232 drain combine as the gate input AA 213 to NFET 231. The drain of PFET 233 and the drain of NFET 235 combine as the gate input to PFET 234. The drain of PFET 223 and the drain of NFET 224 combine as Y 205, which is fed to the gate of PFET 233 and NFET 232.

Power gate THEADER 240 is logically controlled by DISABLE signal 201. DISABLE=1 will cause THEADER 240 to be 'off', while DISABLE=0 will cause THEADER 240 to be 'on'. The remainder of the circuit controls turn-on and turn-off transients, as described hereafter.

THEADER device 240 is a large PFET device. Thus, to transition header 240 from the 'off' state to the 'on' state sequence requires the application of a sufficiently low voltage on NTEST 207. That is, the voltage on NTEST 207 must be below VDDG 220 by at least the threshold voltage on the THEADER device 240. Ideally, the voltage on NTEST 207 for THEADER 240 to be fully on and remain on is 0 volts (e.g., ground). To effect a low voltage on NTEST 207 requires a logic low voltage on DISABLE input 201. Transistors 221 and 222 form an inverter; transistors 225 and 226 perform an additional inversion, thus providing the required logic at NTEST 207 for THEADER 240 to be on.

FETs 221 and 222 are a CMOS inverter, as also are FETs 223 and 224.

FET 225 in series with resistor 191 represent a pull up path 200 on NTEST net 207, taking net 207 up to the global voltage VDDG 220 at the source input to FET 225.

FET 226 in series with resistor 193 represent a pull down path 211 on NTEST net 207, taking net 207 down to global ground GND 192 at the source of FET 226.

FET devices 221 and 222 provide a level of inversion, and FETs 225 and 226 provide another level of inversion, thus bringing the signal on line 207 back in phase with the input DISABLE signal 201.

Resistors 191 and 193 are included for controlling the transition of NTEST net 207.

Power gate control 202 FET devices 221, 222, 225, 226, and resistors 191, 193 form an analog inversion function on DISABLE 201 input, and manage the analog behavior of the output signal at NTEST 207. The goal, which is to minimize the di/dt transients and noise generated, is achieved by slowing the rate of change of NTEST 207, the gate-source voltage VGS on THEADER. Transistors 225 and 226, along with the resistors 191 and 193, accomplish slowing this rate of change.

Figure 9:
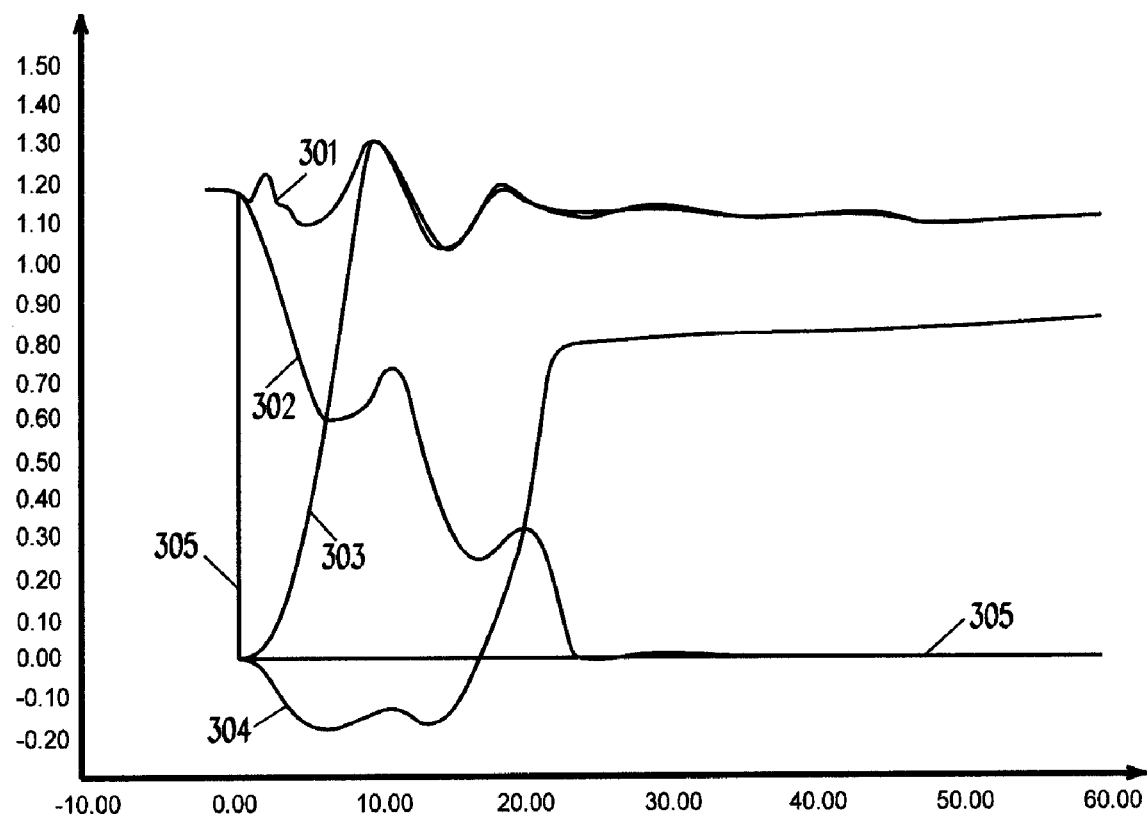
FIG. 9 is a waveform representation of OFF to ON state transition of the header of FIG. 7.

Referring to FIG. 9, the voltage on NTEST 207 when voltage 201 (DISABLE) is switched from a logic high to a logic low is represented by line 302, the voltage on VDDG 220 is represented by line 301, the voltage on VDDI 218 is represented by line 303, and the voltage on AA 213 is represented by line 304.

The minimum set of devices to control THEADER 240 comprises transistors 221, 222, 225, 226 and resistors 191 and 193. While this minimum set of devices theoretically would be sufficient, in practice additional devices may be needed, due to locally generated noise and current leakage, to hold NTEST 207 at a low logic level and guarantee that THEADER 240 remains on. Transistors 223, 224, 229, 228, 231, and 232 serve this purpose.

Transistors 223 and 224 form an inverter, thus node Y 205 is in phase with the input DISABLE 201. When DISABLE 201 transitions from logic HIGH to LOW, node Y 205 also transitions from HIGH to LOW, causing NFET transistor 232 to turn OFF and PFET transistor 228 to begin to turn ON, which allows node AA 213 to charge towards voltage (VDDG−Vtp) 220.

In turn on finisher 204, NTEST 207 and NFET device 231 form a pull down path to hold the gate of PFET 240 at GND 192. FET devices 229 and 228 provide a turn on path for NFET 231, and NFET 232 is the turn off device for NFET 231.

In turn off finisher 206, PFET 234 is a pull up device on NTEST 207, to pull up NTEST 207 to the VDDG 220 level at the source input to PFET 234. PFET 233 is the turn off device for PFET 234, and FET devices 235 and 236 are the turn on path for PFET 234.

While FET devices 228, 229, and 235, 236 represent a preferred embodiment of turn on paths for NFET 231 and PFET 234, respectively, those of skill in the art will recognize that other device configurations may provide a similar turn on function.

When node AA 213 rises above the threshold voltage of NFET device 231, NFET 231 will turn on, shorting the source of transistor 231 to its drain NTEST 207, which will be very close to ground 192 potential, thus guaranteeing that THEADER 240 will remain solidly ON, even in the presence of switching noise on VDDI 218. This is important, since otherwise VDDI 218 noise could modulate the gate voltage 207 of THEADER 240 and thus cause timing failures of the circuits 198 in the island 190 (FIG. 3).

Referring further to FIG. 7, for device THEADER 240 to transition from the ON state to the OFF state, a sufficiently high voltage on NTEST 207, below VDDG 220 by less than the THEADER 240 threshold voltage, is required. Ideally, the voltage on NTEST 207 for THEADER 240 to be fully OFF is VDDG 220. To effect a logic high voltage on NTEST 270 requires a logic HIGH on DISABLE input 201. Again, PFET 221, NFET 222, PFET 225 and NFET 226 and the two resistors 191 and 193 provide two levels of inversion and result in a logic HIGH on NTEST 207. However, the logic HIGH on NTEST 207 produced by PFET 225 and NFET 226 and the resistors 191, 193 is somewhat soft and is susceptible to locally generated noise. Consequently, transistors NFET 233, PFET 234, NFET 235 and PFET 236 are added to further control NTEST 207 for the ON to OFF transition. Node Y 205 is connected to the gate of PFET 233; when Y 205 is at a logic HIGH, PFET 233 is OFF. When NTEST 207 transitions from LOW to HIGH, NFET 235 turns on, and through PFET 236 allows node CC 215 to fall to GND 192+Vtn (the threshold voltage). PFET 236 provides a trip point for PFET 234 to turn on and fully turn off THEADER 240. When node CC 215 falls below VDDG 220−Vtp (the threshold voltage), PFET 234 will turn on, pulling NTEST 207 solidly to VDDG 220 and guaranteeing that THEADER 240 will remain OFF, as above, even in the presence of switching noise on VDDI 218.

Figure 8:
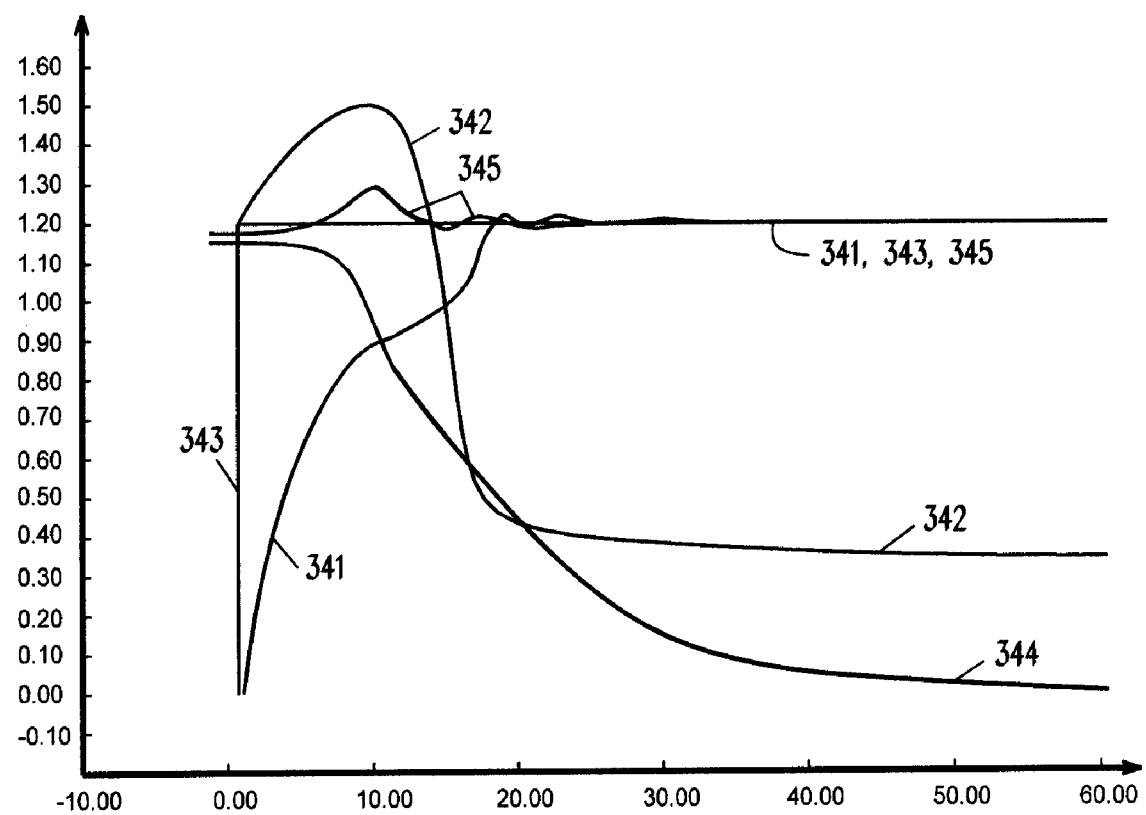
FIG. 8 is a waveform representation of ON to OFF state transition of the header of FIG. 7.

Referring to FIG. 8, the waveforms for DISABLE, NTEST, and CC during the ON to OFF state transition are illustrated. The voltage on DISABLE 201 is represented by line 343, the voltage on NTEST 207 is represented by line 341, the voltage on VDDG 220 is represented by line 345, the voltage on VDDI 218 is represented by line 344, and the voltage at node CC 215 is represented by line 342.

Several alternative embodiments, or variations on the preferred embodiments described above are possible.

In general, devices 229, 228, 231, and 232 (comprising turn-on finisher 204) are responsible for "finishing" the turn-on of the header device, THEADER 204, while devices 233, 234, 235 and 236 are responsible for finishing the turn-off of the header. If an application is more sensitive to turn-on than turn-off di/dt (e.g. because the island logic is clock gated off before a turn-off event), then devices 233, 234, 235 and 236 may be removed. In the less likely case than an application was more sensitive to turn-off than turn-on di/dt, devices 229, 228, 231, and 232 could be eliminated.

Resistors 191, 193 are intended to provide means for tuning the drive strength of devices 225 and 226 to deliver a low and well-controlled initial dVgs/dt on NTEST 207 to THEADER 240. If the resistors are either less desirable or simply unavailable in a particular application, they may be removed and devices 225 and 226 adjusted to a width suitable to obtain the drive current required to control the initial transition rate on NTEST 207.

The series combination of devices 228 and 229 establish the voltage at which turn-on finisher 204 is activated. Similarly, the series combination of devices 235 and 236 establish the voltage at which the turn-off finisher 206 is activated. Devices 228, 229, 235, and 236 may be replaced by a variety of other device configurations to establish these trip points.

Referring to FIG. 11, in accordance with an alternative embodiment of the invention, a footer circuit 290 addresses the transient noise problem. Footer circuit 290 includes power gate 270 connected between GNDI 197 (island ground) and GNDG 192 (global ground), power gate control 282, turn on finisher circuit 284 and turn off finisher circuit 286. Power gate control 282 is also connected to turn on finisher 284 and turn off finisher 286. Circuitry common to finishers 284 and 286, such as inverter 288, may be shared by circuits 284 and 286, or replicated in each of circuits 284 and 286.

Figure 12:
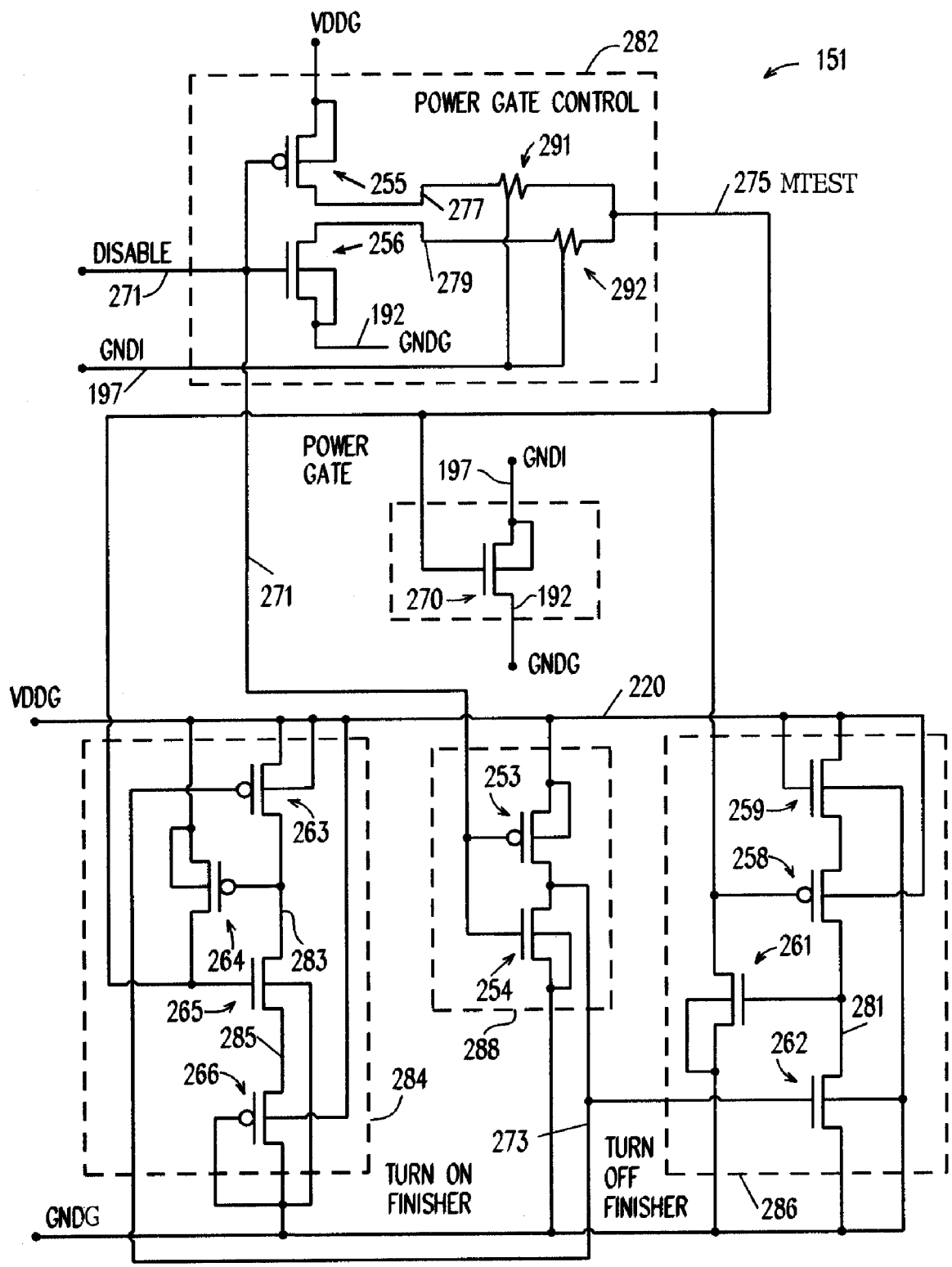
FIG. 12 is a more detailed diagrammatic representation of a footer device in accordance with an alternative embodiment of the invention.

Responsive to disable signal 201, rate control and inverter 246 selectively pulls up or pulls down MTEST 275 through respective paths 242, 244, in a manner analogous to that previously described (FIG. 4), and to be described more fully hereafter in connection with the exemplary embodiment of FIG. 12. Turn on finisher 284 includes a pull up FET 264, controlled by turn on 248 and turn off 250 paths to voltage levels 192 and 220 and the output of inverter 288. Turn off finisher includes a pull down FET 261, controlled by turn on 251 and turn off 252 paths to voltage levels 192 and 220 and the output of inverter 288.

The function of finisher 284 is to assure that power gate 270 is fully turned off by driving the gate of power gate 270 to ground 192. The function of turn off finisher 286 is to hold MTEST 275 at ground potential, insuring that footer power gate 270 remains OFF, as will be more fully described hereafter in connection with FIG. 12.

In accordance with the preferred embodiments of the invention, footer is turned on when disable is low, and turned off when disable is high. When footer is disabled, then the footer is OFF.

Figure 10:
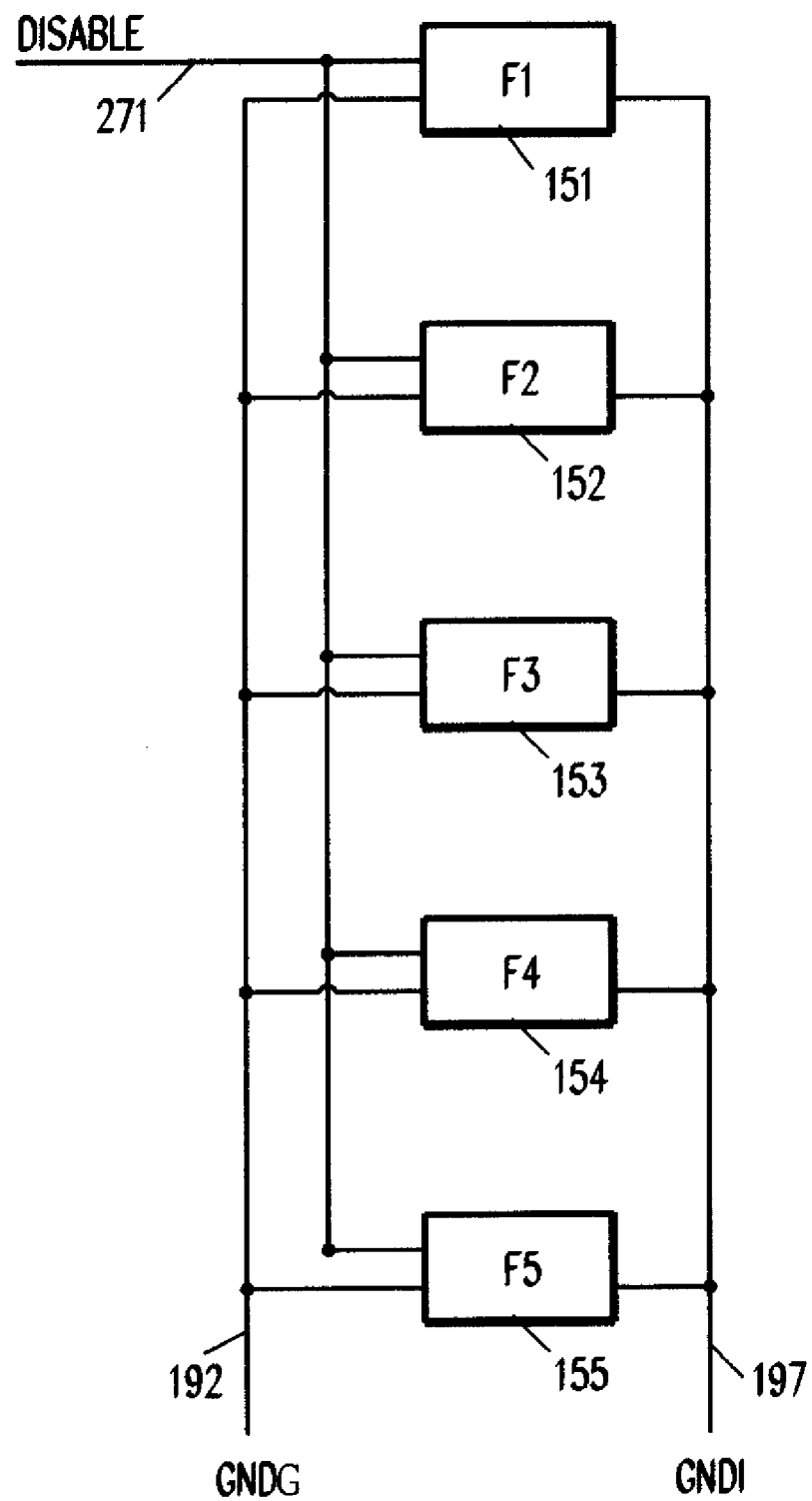
FIG. 10 is a diagrammatic representation of footers arranged in parallel on a voltage island.

Referring to FIG. 10, an exemplary embodiment of a configuration of footer circuits on a voltage island comprises power gates, or footers, 151–155 interconnecting global ground GND, or GNDG, 192 and island ground GNDI 197. Disable line 271 is fed to each footer in parallel. The footer circuits can be considered the "dual" of the header circuit, thus operation is similar.

Referring to FIG. 12, an exemplary footer 151, identical to footers 152–155, is illustrated, and includes a power gate NFET device 270, placed between global ground GNDG 192 and island ground GNDI 197. Power gate control 282 comprises PFET 255, NFET 256, and variable resistors 291, 292. Turn on finisher 284 comprises PFET devices 266, 263 and 264 and NFET device 265. Turn off finisher 286 comprises PFET device 258 and NFET devices 259, 261, and 262. Global voltage VDDG 220 is fed to devices 255, 263, 264, 266, 253, 258, 259. Global ground GND or GNDG 192 is connected to FOOTER 270, and devices 256, 259, 266, 265, 254, 261, and 262. Island ground GNDI 197 is connected to power gate 270 and to variable resistors 291, 292. DISABLE signal 271 is connected to devices 255, 256, 253, and 254. MTEST output 275 from power gate control 282 is fed to power gate 270, and to devices 264, 265, 258, and 261.

FET devices 253, 254 provide an inversion function.

In power gate control 282, PFET 255 and resistor 291 provide a pull up path, and NFET 256 and resistor 292 provide a pull down path, on MTEST 275. In combination, FET devices 255, 256 and resistors 291, 292 provide an analog inversion function.

In turn off finisher 286, NFET 261 is the turn off device for MTEST 275, to assure that power gate 270 is fully turned off by driving the gate of power gate 270 to ground. FET devices 258, 259 are the turn on path for NFET 261, and NFET 262 is the turn off device for NFET 261.

In turn on finisher 284, PFET 264 is the turn on device for MTEST 275, guaranteeing that net 275 is fully pulled up to VDDG 220 to turn on power gate 270 completely. PFET 263 is the turn off device for PFET 264, and FET devices 265, 266 are the turn on path for PFET 264.

Again, other device configurations may be utilized to pull up/pull down FET devices 261 and 264, as will be apparent to those of skill in the art.

In operation, the OFF state to ON state sequence of footer device 151 requires a sufficiently high voltage on MTEST net 275 at the gate of NFET 270. Thus, MTEST 275 needs to be above ground by at least the threshold of device 270, ideally this voltage would be VDDG 220. To effect a high voltage on MTEST 275 requires applying a low voltage on DISABLE 271, the input to devices 255 and 256 in power gate control 282. Devices 255 and 256, along with variable resistors 291 and 292 act as an inverter, providing a slow turn-on for footer device 270.

Devices 263, 264, 265 and 266 comprise the turn-on finisher 284. In operation, devices 253 and 254 provide the inversion of the DISABLE signal on 271. NFET 265 will turn on when MTEST net 275 rises above ground by approximately the transition voltage Vt of PFET 266. This allows PFET 264 to turn on, and guarantees a solid VDDG 220 level on MTEST 275, insuring that the footer power gate 270 remains ON.

Devices 259, 258, 261, and 262 comprise the turn-off finisher 286. In operation, the ON state to OFF state sequence of footer device 270 requires a low voltage, ideally ground, or 0 volts, on MTEST net 275. DISABLE 271 in turn must be set to a logical 1 (a high voltage level). Once again, devices 253 and 254 provide the inversion of the DISABLE signal 271, thus net 273 is at a logic low level (close to ground potential). Device 262 will be OFF, but PFET 258 will turn on once MTEST net 275 drops below VDDG 220 by approximately the threshold voltage Vt of device 259. When device 258 turns on, net 281 will be pulled high, allowing device 261 to turn on. With NFET 261 turning on, net MTEST 275 is held at ground potential, insuring that footer power gate 270 remains OFF.

The circuit as described above is part of the design for an integrated circuit chip. The chip design is created in a graphical computer programming language, and sotred in a computer storage medium (such as a disk, tape, physical hard drive, or virtual hard drive such as in a storage access network). If the designer does not fabricate chips or the photolithographic masks used to fabricate chips, the designer transmits the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multi chip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

Advantages Over the Prior Art

In accordance with the preferred embodiments of the invention, there is provided a power gating architecture and header and footer circuits which may be used to control leakage while managing transient power supply noise. The result is a more uniform distribution of power thereby avoiding localized "hotspots", or electro-migration during transitions, providing island turn-on and turn-off times that are largely independent of island size, and controlling power gate turn-on and turn-off behavior without the need for external analog voltages or sequential logic.

Alternative Embodiments

It will be appreciated that, although specific embodiments of the invention have been described herein for purposes of illustration, foregoing and additional modifications may be made without departing from the spirit and scope of the invention.

Accordingly, the scope of protection of this invention is limited only by the following claims and their equivalents.

What is claimed is:

1. System for gating power from global terrain to a voltage island while controlling leakage and managing transient power supply noise, comprising:
   a global terrain;
   a voltage island;
   a global voltage source;
   a disable signal source;
   said voltage island including
      a field effect transistor (FET) power gate;
      a first connection to said global voltage source;
      a second connection to said disable signal source;
   an island voltage net for supplying voltage to devices on said island;
      a power gate control circuit responsive to said disable signal source for generating a test signal for selectively turning OFF said FET power gate as said disable signal source goes to a logical '1', and for turning ON said FET power gate as said disable source goes to a logical '0';
      said FET power gate responsive to said disable signal source being OFF for connecting said island voltage net to said global voltage source;
      a turn ON finisher circuit responsive to said disable signal transitioning to ON and to said test signal for holding said power gate solidly ON; and
      a turn OFF finisher circuit responsive to said disable signal transitioning to OFF and to said test signal for holding said power gate solidly OFF.

2. The system of claim 1, said global voltage source being global voltage VDDG, said FET power gate being a PFET header device, and said island voltage net being island voltage VDDI.

3. The system of claim 2, said power gate control circuit including a first inverter feeding a second inverter for driving said test signal in phase with said disable signal.

4. The system of claim 3, said second inverter including:
   a pull up path and a pull down path;
   said pull down path responsive to said disable signal source going to a logical '1' for slightly delaying and pulling down said test signal to ground to turn on said power gate to connect said global voltage to said island voltage upon said test signal reaching a transition voltage.

5. The system of claim 4,
   said pull up path responsive to said disable signal source going to a logical '0' for slightly delaying and pulling up said test signal to said global voltage to turn off said power gate upon said test signal reaching a transition voltage.

6. The system of claim 5, said turn ON finisher circuit comprising a pull down FET device which in series with said test signal forms a pull down path to hold the gate of said power gate at ground.

7. The system of claim 6, said turn OFF finisher circuit comprising a pull up FET device which in series with said test signal forms a pull up path to hold the gate of said power gate at global voltage.

8. The system of claim 1, said global voltage source being a global ground GNDG, said FET power gate being an NFET footer device, and said island voltage net being island ground GNDI.

9. The system of claim 8, said power gate selectively turning ON and OFF responsive to said disable signal.

10. The system of claim 9, said power gate control circuit including a pull up path and pull down path responsive to said disable signal for selectively pulling up and pulling down said test signal.

11. The system of claim 10, further comprising a turn ON finisher including an NFET device for fully turning ON said power gate by driving test signal to said global voltage.

12. The system of claim 11, further comprising a turn OFF finisher including an NFET device for holding the gate of said power gate to ground for holding said power gate fully OFF.

13. The system of claim 1, said island further comprising a plurality of said power gates connected in parallel to said disable signal source by respective power gate control circuits and finisher circuits.

14. Method for gating power from global terrain to a voltage island while controlling leakage and managing transient power supply noise, comprising the steps of:
   supplying a global voltage to a voltage island;
   supplying a disable signal to said voltage island;
   responsive to said disable signal, selectively shorting said global voltage to a voltage net on said voltage island through a field effect transistor (FET) power gate;
   operating a power gate control circuit responsive to said disable signal source to generate a test signal for selectively turning OFF said FET power gate as said disable signal source goes to a logical '1', and for turning ON said FET power gate as said disable source goes to a logical '0';
   operating said FET power gate responsive to said disable signal source being in a logic low state for for connecting said island voltage net to said global voltage;
   operating a turn ON finisher circuit responsive to said disable signal transitioning to a logic low state and to said test signal to hold said power gate solidly ON; and
   operating a turn OFF finisher circuit responsive to said disable signal transitioning to OFF and to said test signal to hold said power gate solidly OFF.

15. The method of claim 14, said global voltage source being global voltage VDDG, said FET power gate being a PFET header device, and said island voltage net being island voltage VDDI.

16. The method of claim 15, further comprising:
including in said power gate control circuit a first inverter feeding a second inverter for driving said test signal in phase with said disable signal;
including in said second inverter a pull up path and a pull down path;
operating said pull down path responsive to said disable signal source going to a logical '1' for slightly delaying and pulling down said test signal to ground to turn on said power gate to connect said global voltage to said island voltage upon said test signal reaching a transition voltage; and
operating said pull up path responsive to said disable signal source going to a logical '0' for slightly delaying and pulling up said test signal to said global voltage to turn off said power gate upon said test signal reaching a transition voltage.

17. The method of claim 16, further comprising:
operating a pull down FET device in said turn ON finisher circuit in series with said test signal to form a pull down path for holding the gate of said power gate at ground; and
operating a pull up FET device in said turn OFF finisher circuit in series with said test signal to form a pull up path for holding the gate of said power gate at global voltage.

18. The method of claim 14, said global voltage source being a global ground GNDG, said FET power gate being an NFET footer device, and said island voltage net being island ground GNDI.

19. The method of claim 18, said power gate selectively turning ON and OFF responsive to said disable signal, and further comprising:
providing in said power gate control circuit a pull up path and pull down path responsive to said disable signal for selectively pulling up and pulling down said test signal;
providing in a turn ON finisher an NFET device for fully turning ON said power gate by driving said test signal to said global voltage; and
providing in a turn OFF finisher an including an NFET device for holding the gate of said power gate to ground for holding said power gate fully OFF.

20. The method of claim 14, said island further comprising a plurality of said power gates connected in parallel to said disable signal source by respective power gate control circuits and finisher circuits.

* * * * *